United States Patent [19]

Kayaba et al.

[11] Patent Number: 5,476,884
[45] Date of Patent: Dec. 19, 1995

[54] SEMICONDUCTOR DEVICE-ENCAPSULATING EPOXY RESIN COMPOSITION CONTAINING SECONDARY AMINO FUNCTIONAL COUPLING AGENTS

[75] Inventors: Keiji Kayaba; Yasushi Sawamura; Masayuki Tanaka, all of Nagoya, Japan

[73] Assignee: Toray Industries, Inc., Tokyo, Japan

[21] Appl. No.: 312,672

[22] Filed: Sep. 28, 1994

Related U.S. Application Data

[63] Continuation of Ser. No. 182,839, Jan. 19, 1994, abandoned, which is a continuation of Ser. No. 58,687, May 10, 1993, abandoned, which is a continuation of Ser. No. 939,043, Sep. 3, 1992, abandoned, which is a continuation of Ser. No. 659,176, Feb. 22, 1991, abandoned, which is a continuation-in-part of Ser. No. 480,968, Feb. 16, 1990, abandoned.

[30] Foreign Application Priority Data

Feb. 20, 1989 [JP] Japan ................................. 1-41057
Feb. 20, 1989 [JP] Japan ................................. 1-41058

[51] Int. Cl.$^6$ ........................... C08L 63/00; C08K 7/08
[52] U.S. Cl. ..................... 523/443; 525/109; 525/122; 525/476; 525/481; 525/482; 525/487; 528/27
[58] Field of Search ..................... 523/443; 525/481, 525/482, 487; 528/27

[56] References Cited

U.S. PATENT DOCUMENTS

| | | | |
|---|---|---|---|
| 4,639,476 | 1/1987 | Tajiri et al. | 523/213 |
| 4,701,479 | 10/1987 | Shiobara et al. | 523/220 |
| 4,720,515 | 1/1988 | Iji et al. | 523/435 |

FOREIGN PATENT DOCUMENTS

| | | |
|---|---|---|
| 57-155753 | 9/1982 | Japan . |
| 63-251419 | 10/1988 | Japan . |

*Primary Examiner*—Frederick Krass
*Attorney, Agent, or Firm*—Birch, Stewart, Kolasch & Birch

[57] ABSTRACT

Disclosed is a semiconductor-encapsulating epoxy resin composition comprising (A) an epoxy resin, (B) a curing agent, and (C) fused silica which has been surface-treated with a silane coupling agent having a secondary amino group. This composition has a good moldability and reliability, and a good solder dipping stability.

10 Claims, No Drawings

SEMICONDUCTOR DEVICE-ENCAPSULATING EPOXY RESIN COMPOSITION CONTAINING SECONDARY AMINO FUNCTIONAL COUPLING AGENTS

This application is a Continuation of Ser. No. 08/182,839 filed on Jan. 19, 1994 now abandoned, which is a Continuation of Ser. No. 08/058,687 filed on May 10, 1993 now abandoned, which is a Continuation of Ser. No. 07/939,043 filed on Sep. 3, 1992 now abandoned, which is a Continuation of Ser. No. 07/659,176 filed on Feb. 22, 1991 now abandoned, which is a Continuation-in-Part of Ser. No. 07/480,968 filed Feb. 16, 1990, now abandoned.

BACKGROUND OF THE INVENTION

1. Field of the Invention

This invention relates to a semiconductor-encapsulating epoxy resin composition having excellent moldability and reliability and a good solder dipping stability.

2. Description of the Related Art

Epoxy resins have an excellent heat resistance, moisture resistance, and electrical characteristics, and various characteristics can be obtained by modifying the recipes thereof. Accordingly, therefore, epoxy resins are used as for paints, adhesives, and industrial materials such as electrically insulating materials.

As methods of encapsulating electronic circuit parts such as semiconductor devices, a hermetic encapsulating method using metals or ceramics, and a resin encapsulating method using a phenolic resin, a silicone resin, an epoxy resin or the like have been proposed, but from the economical viewpoint, the productivity and the balance among physical properties, the resin encapsulating method using an epoxy resin is mainly adopted.

According to the encapsulating method using an epoxy resin, a composition formed by adding a curing agent, a filler and the like is used, and a semiconductor element is set in a mold and is usually encapsulated by the transfer molding method or the like.

The main characteristics required for the encapsulating epoxy resin composition are reliability and moldability. The moisture resistance is included by the term reliability, and the flowability, hot hardness and flash-preventing property are included by the term moldability.

When a resin-encapsulated semiconductor is allowed to stand in a high-temperature and high-humidity environment, water seeps through the encapsulating resin or the interface between the encapsulating resin and a lead frame to cause defects in the semiconductor. Accordingly, the term moisture resistance as used herein refers to the property of preventing or minimizing the above-mentioned imperfections of the semiconductor caused by water. Note the recent increases in the degree of integration of semiconductors has led to a demand for a higher moisture resistance.

Usually, a silane coupling agent is added, to improve the moisture resistance of an encapsulating resin. More specifically the addition of an epoxysilane (Japanese Examined Patent Publication No. 62-18565), the addition of a mercaptosilane (Japanese Unexamined Patent Publication No. 55-153357), and the addition of an aminosilane having a primary amino group (Japanese Unexamined Patent Publication No. 57-155753) have been proposed.

The addition of a silane coupling agent to a sealing resin effectively improve the moisture resistance, but it has been found that a higher moisture resistance is required for a semiconductor having a high degree of integration and the moisture resistance provided by the conventional silane coupling agents is still too low.

In the conventional method of adding an aminosilane having a primary amino group, the moisture resistance is improved, and simultaneously, moldability-improving effects such as an improvement of the hot hardness and reduction of the formation of flash are obtained. Nevertheless, this method cannot be practically adopted because the flowability is reduced.

In the field of semiconductor integrated circuits, techniques of increasing the integration degree and reliability recently have been developed, and the automation of the step of assembling semiconductor devices has been advanced.

To attach a semiconductor device of the flat package type to a circuit board, a method has been adopted in which soldering of every lead pin is carried out, but currently a surface mounting method is employed in which a semiconductor device is entirely dipped in a solder bath heated to a temperature higher than 250° C. to effect soldering. Accordingly, in a conventional package encapsulated by an encapsulating resin, cracking of the resin portion occurs at the soldering step, whereby the reliability is lost, and accordingly, the obtained product cannot be practically used.

Various methods of improving the solder cracking resistance of encapsulating resins have been examined. For example, a method of using a biphenyl type epoxy resin has been proposed (Japanese Unexamined Patent Publication No. 63-251419). This method of using a biphenyl type epoxy resin improves the solder cracking resistance of the encapsulating resin, but the moisture resistance is lowered, the hot hardness at the molding is, low and the formation of flash is heightened.

SUMMARY OF THE INVENTION

Therefore, a primary object of the present invention is to solve the above-mentioned problems of conventional semiconductor-encapsulating epoxy resin compositions, and to provide an epoxy resin composition having an excellent reliability such as a high moisture resistance, and moldability such as a hot hardness and a flash-prevention property, and having a good solder dipping stability, to thereby obtain a resin-encapsulated semiconductor to which the surface mounting method can be applied.

In accordance with the present invention, there is provided a semiconductor-sealing epoxy resin composition comprising (A) an epoxy resin, (B) a curing agent, and (C) fused silica surface-treated with a silane coupling agent having a secondary amino group.

DESCRIPTION OF THE PREFERRED EMBODIMENTS

An epoxy resin having at least two epoxy groups in the molecule can be used as the epoxy resin (A) in the present invention, without any particular limitation. As examples of the epoxy resin (A), there can be mentioned a cresol-novolak epoxy resin, a biphenyl type epoxy resin, a bisphenol A type epoxy resin, a linear aliphatic epoxy resin, an alicyclic epoxy resin, a heterocyclic epoxy resin, a halogenated epoxy resin and a spiro ring-containing epoxy resin. At least two of these epoxy resins can be used in combination in some applications.

From the viewpoint of the solder dipping stability of the composition, a biphenyl type epoxy resin having a skeleton represented by the following formula (I) is contained as an indispensable component of the epoxy resin (A):

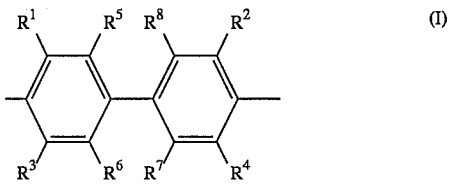

wherein $R^1$ through $R^8$ independently represent a hydrogen atom, a lower alkyl group having 1 to 4 carbon atoms or a halogen atom.

As preferred examples of $R^1$ through $R^8$ in the above-mentioned formula (I), there can be mentioned a hydrogen atom, a methyl group, an ethyl group, a n-propyl group, an i-propyl group, a n-butyl group, a sec.-butyl group, a tert.-butyl group, a chlorine atom, and a bromine atom.

As specific examples of the biphenyl type epoxy resin having a skeleton represented by the above-mentioned formula (I), there can be mentioned 4,4'-bis(2,3-epoxypropoxy)biphenyl, 4,4'-bis(2,3-epoxypropoxy)-3,3',5,5'-tetramethylbiphenyl, 4,4'-bis(2,3-epoxypropoxy)-3,3',5,5'-tetramethyl-2-chlorobiphenyl, 4,4'-bis(2,3-epoxypropoxy)-3,3',5,5'-tetramethyl-2-bromobiphenyl, 4,4'-bis(2,3-epoxypropoxy)-3,3',5,5'-tetraethylbiphenyl, and 4,4'-(2,3-epoxypropoxy)-3,3',5,5'-tetrabutylbiphenyl.

The amount of the epoxy resin (A) is preferably 3 to 30% by weight, more preferably 5 to 25% by weight, based on the total resin composition.

Any curing agent capable of reacting with and curing the epoxy resin (A) can be used as the curing agent (B) in the present invention. For example, there can be mentioned a phenol-novolak resin, a cresol-novolak resin, a novolak resin represented by the following formula (II):

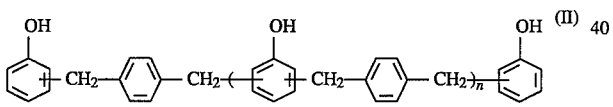

wherein n is 0 or an integer of at least 1, novolak resins synthesized from bisphenol A or resorcinol, various polyhydric phenol compounds, acid anhydrides such as maleic anhydride, phthalic anhydride and pyromellitic anhydride, and aromatic amines such as methaphenylenediamine, diaminodiphenylmethane, and diaminodiphenylsulfone.

In view of the heat resistance, moisture resistance and storage stability of a semiconductor device-sealing epoxy resin, a curing agent composed of a novolak resin such as a phenol-novolak resin or a cresol-novolak resin is preferably used. A mixture of two or more of these curing agents can be used according to need.

The amount of the curing agent (B) is preferably 1 to 20% by weight, more preferably 2 to 15% by weight, based on the total resin composition.

In view of the mechanical properties and moisture resistance, preferably the mixing ratio of the epoxy resin (A) and the curing agent (B) is such that the chemical equivalent ratio of the component (B) to the component (A) is from 0.5 to 1.6, more preferably from 0.8 to 1.3.

In the present invention, fused silica (C), which has been surface-treated with a silane coupling agent having a secondary amino group(which coupling agent is hereinafter referred to "silane coupling agent (D)") is used. Fused silica has a function of highly reducing the linear expansion coefficient of the resulting molded article and effectively reducing the stress thereof. The amount of the fused silica (C) is usually 70 to 95% by weight based on the total resin composition. From the viewpoint of the solder dipping stability, preferably the amount of the fused silica (C) is 73 to 90% by weight based on the total resin composition, and preferably fused silica (C) comprises (C') 90 to 40% by weight of crushed fused silica having an average particle diameter not larger than 12 μm and (C") 10 to 60% by weight of spherical fused silica having an average particle diameter not larger than 40 μm. The average particle diameter referred to herein means the particle diameter (median diameter) at which the cumulative weight is 50%.

From the view point of the reliability, fused silica (C) must be surface-treated with the silane coupling agent (D) prior to the preparation of the epoxy resin composition. The surface-treatment of the fused silica (C) with the silane coupling agent (D) can be carried out by conventional methods, for example, by mixing the fused silica (C) with the silane coupling agent (D).

The silane coupling agent (D) used in the present invention is characterized in that the amino group or all of the amino groups contained therein are secondary amino groups. By the use of the silane coupling agent (D), the moldability and reliability can be synergistically improved, compared with the case where a conventional coupling agent having a primary amino group is used, and the flowability of the composition is remarkably improved, and thus a thin package in which the formation of flash is reduced can be molded.

As specific examples of the silane coupling agent (D), there can be mentioned compounds represented by the following formulae (III) and (IV):

and

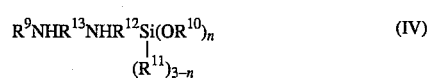

wherein $R^9$ through $R^{11}$ independently represent a monovalent hydrocarbon group having 1 to 20 carbon atoms, and $R^{12}$ and $R^{13}$ independently represent a divalent hydrocarbon group having 1 to 20 carbon atoms, and n is an integer of 1 to 3.

Among these silane coupling agents, a compound of the formula (III) in which $R^9$ represents a phenyl group, $R^{10}$ and $R^{11}$ represent a methyl group and/or an ethyl group, $R^{12}$ represents a propylene group and n is 2 or 3 is preferably used as the silane coupling agent (D), because the effects of improving the moldability and reliability are high.

In view of the moldability and reliability, preferably the silane coupling agent (D) is incorporated in an amount of 0.1 to 5 parts by weight, more preferably 0.2 to 3 parts by weight, most preferably 0.3 to 1.5 parts by weight, per 100 parts by weight of the fused silica. A silane coupling agent such as an epoxysilane or mercaptosilane can be used in combination with the silane coupling agent (D) according to need.

To improve the solder dipping stability, an aromatic vinyl hydrocarbon-conjugated diene block copolymer (E) can be further added to the composition of the present invention. The aromatic vinyl hydrocarbon-conjugated diene block copolymer (E) includes a linear, parabolic or branched block copolymer comprising blocks of an aromatic vinyl hydrocarbon polymer having a glass transition temperature of at least 25° C., preferably at least 50° C., and blocks of a conjugated diene polymer having a glass transition temperature not higher than 0° C., preferably not higher than −25° C.

As the aromatic vinyl hydrocarbon, there can be mentioned styrene, α-methylstyrene, o-methylstyrene, p-methylstyrene, 1,3-dimethylstyrene, and vinylnaphthalene, and of these compounds, styrene is preferably used.

As the conjugated diene, there can be mentioned butadiene (1,3-butadiene), isoprene (2-methyl-1,3-butadiene), methylisoprene (2,3-dimethyl-1,3-butadiene) and 1,3-pentadiene, and of these conjugated dienes, butadiene and isoprene are preferably used.

The proportion of the blocks of the aromatic vinyl hydrocarbon, which are blocks of the glass phase, in the block copolymer (E) is preferably 10 to 50% by weight, and the proportion of the blocks of the conjugated diene polymer, which are blocks of the rubber phase, is preferably 90 to 50% by weight.

Many combinations of the blocks of the glass phase and the blocks of the rubber phase are possible and any of these combinations can be adopted, but a triblock copolymer comprising blocks of the glass phase bonded to both ends of the intermediate block of the rubber phase is preferably used.

In this case, the number average molecular weight of the block of the glass phase is preferably 5,000 to 150,000, more preferably 7,000 to 60,000, and the number average molecular weight of the block of the rubber phase is preferably 10,000 to 300,000, more preferably 30,000 to 150,000.

The aromatic vinyl hydrocarbon-conjugated diene block copolymer (E) can be prepared by the known living anionic polymerization process, but the preparation thereof is not limited to this polymerization process. Namely, the aromatic vinyl hydrocarbon-conjugated diene block copolymer (E) also can be prepared by the cationic polymerization process and the radical polymerization process.

The aromatic vinyl hydrocarbon-conjugated diene block copolymer (E) also includes a hydrogenated block copolymer formed by reducing parts of unsaturated bonds of the above-mentioned block copolymer by hydrogenation. In this case, preferably not more than 25% of aromatic double bonds of the blocks of the aromatic vinyl hydrocarbon polymer is hydrogenated, and at least 80% of aliphatic double bonds of the blocks of the conjugated diene polymer is hydrogenated.

As preferable examples of the aromatic vinyl hydrocarbon-conjugated diene block copolymer (E), there can be mentioned a polystyrene/polybutadiene/polystyrene block copolymer (SBS), a polystyrene/polyisoprene/polystyrene triblock copolymer (SIS), a hydrogenated copolymer of SBS (SEBS), and a hydrogenated copolymer of SIS. Of these, a hydrogenated copolymer of SBS (SEBS) and a hydrogenated copolymer of SIS are more preferable in view of the heat resistance.

The amount of the aromatic vinyl hydrocarbon-conjugated diene block copolymer (E) incorporated is preferably 0.2 to 5% by weight, more preferably 1 to 4% by weight, based on the total resin composition.

To reduce the stress and to improve the reliability, a modified silicone oil (F) can be further added to the composition of the present invention.

The modified silicone oil (F) used in the present invention has an organopolysiloxane structure. As specific examples, there can be mentioned compounds represented by the following formula (V):

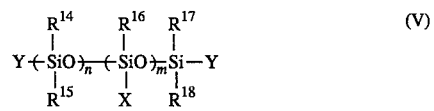

wherein $R^{14}$ through $R^{18}$ independently represent a hydrogen atom at least one functional group selected from the group consisting of an alkyl group having 1 to 20 carbon atoms, a phenyl group and a vinyl group, X and Y represent at least one functional group selected from the group consisting of an alkyl group having 1 to 20 carbon atoms, a phenyl group, a vinyl group, a hydroxyl group, an amino group, an epoxy group, a carboxyl group, a mercapto group, a polyoxyalkylene group, an alkoxy group and a fluorine atom, with the proviso that Y can be a hydrogen atom, and m is an integer of at least 1 and n is 0 or an integer of at least 1.

To reduce the stress and improve the reliability, preferably the modified silicone oil (F) is incorporated in an amount of 0.01 to 5% by weight, more preferably 0.1 to 3% by weight, most preferably 0.3 to 2% by weight, based on the total resin composition.

In the present invention, a curing catalyst can be used for promoting the curing reaction between the epoxy resin (A) and the curing agent (B), and any compound capable of promoting the curing reaction can be used in the present invention without limitation. For example, there can be used imidazole compounds such as 2-methylimidazole, 2,4-dimethylimidazole, 2-ethyl-4-methylimidazole, 2-phenylimidazole, 2-phenyl-4-methylimidazole and 2-heptadecylimidazole, tertiary amine compounds such as triethylamine, benzyldimethylamine, α-methylbenzyldimethylamine, 2-(dimethylaminomethyl)phenol, 2,4,6-tris(dimethylaminomethyl)phenol and 1,8-diazabicyclo(5,4,0)undecene-7, organic metal compounds such as zirconium tetramethoxide, zirconium tetrapropoxide, tetrakis(acetylacetonate)zirconium and tri(acetylacetonate)aluminum, and organic phosphine compounds (G) such as triphenylphosphine, trimethylphosphine, triethylphosphine, tributylphosphine, tri(p-methylphenyl)phosphine and tri(nonylphenyl)phosphine. From the viewpoint of the moisture resistance, an organic phosphine compound (G) is preferably used, and triphenylphosphine is more preferably used.

A mixture of two or more of these curing catalysts can be used according to need. Preferably, the curing catalyst is incorporated in an amount of 0.1 to 10 parts by weight per 100 parts by weight of the epoxy resin (A).

A halogen compound such as a halogenated epoxy resin, a flame retardant such as phosphorus compounds, a flame retardant assistant such as antimony trioxide, a colorant such as carbon black or iron oxide, an elastomer other than the above-mentioned aromatic vinyl hydrocarbon-conjugated diene block copolymer (E), such as a silicone rubber, an olefin copolymer, a modified nitrile rubber or a modified polybutadiene rubber, a thermoplastic resin such as polyethylene, a coupling agent such as a titanate coupling agent, a release agent such as a long-chain fatty acid, a metal salt of a long-chain fatty acid, an ester of a long-chain fatty acid, an amide of a long-chain fatty acid or a paraffin wax, a crosslinking agent such as an organic peroxide, and a filler other than the above-mentioned fused silica, such as crystalline silica, antimony trioxide, calcium carbonate, magnesium carbonate, alumina, magnesia, clay, talc, calcium silicate, titanium oxide or asbestos can be incorporated in the epoxy resin composition of the present invention.

The epoxy resin composition is preferably melt-kneaded. For example, the epoxy resin composition can be prepared by carrying out the melt-kneading according to a known kneading method using a Banbury mixer, a kneader, a roll, a single-screw or twin-screw extruder or a cokneader.

The present invention will now be described in detail with reference to the following examples.

EXAMPLE 1

Fused silica (I) shown in Table 2 and each silane coupling agent shown in Table 3 were dry-blended together by using a mixer to give fused silica surface-treated with the silane coupling agent. Using the resulting surface-treated fused silica, dry blending was carried out at the mixing ratios shown in Tables 1 and 6 by using a mixer. The blend was heated and kneaded for 5 minutes by using a mixing roll having a surface temperature maintained at 90° C., and then cooled and pulverized to prepare an epoxy resin composition.

The moldability characteristics such as the spiral flow, formation of resin flash and hot hardness of the formed composition were evaluated by the low-pressure transfer molding method. A test element was encapsulated with the thermosetting resin and post curing carried out, and the reliability of the device was evaluated. The results are shown in Table 6.

In this example, the properties were evaluated according to the following methods.

(Spiral Flow, Formation of Resin Flash and Hot Hardness)

Molding was carried out at 175° C. for 120 seconds and the respective properties were evaluated.

(Reliability)

A 44-Pin QFP having encapsulated test elements was molded, and post curing was carried out at 175° C. for 5 hours. The QFP was subjected to the unsaturated pressure cooker bias test (USPCBT) at a temperature of 130° C. and a relative humidity of 85% under a bias voltage of 15 V, and the time required for the cumulative failure rate to reach 50% was measured.

As seen from the results shown in Table 6, the epoxy resin composition of the present invention (runs 1 through 3) has excellent moldability characteristics such as spiral flow, formation of resin flash and hot hardness, and a high reliability. In runs 1 and 2, in which the organic phosphine compound (G) is incorporated, the reliability is especially excellent.

In contrast, if the secondary amino group-containing silane coupling agent (D) of the present invention is not used (comparative runs 1 through 3), the moldability and reliability are poor.

TABLE 1

| Component | Content | Amount added (% by weight) |
|---|---|---|
| Epoxy resin A | o-Cresol-novolak type epoxy resin having epoxy equivalent of 190 | * |
| Curing agent B | Phenol-novolak resin having hydroxyl equivalent of 110 | * |
| Curing catalyst | Triphenylphosphine (TPP) or 1,8-diaza-bicyclo(5,4,0)undecene-7 (DBU) | 0.2 |
| Release agent | Stearic acid | 0.3 |
| Flame retardant | Brominated phenol-novolak resin having epoxy equivalent of 270 and bromine content of 36% | 2.3 |
| Flame retardant assistant | Antimony trioxide | 1.5 |
| Colorant | Carbon black | 0.2 |

Note
*The curing agent was added in an amount equivalent to the epoxy resin and flame retardant.

TABLE 2

| | Fused silica | | |
|---|---|---|---|
| Fused silica | Crushed fused silica having average particle diameter of 13.4 μm (% by weight) | Crushed fused silica (C') having average particle diameter of 9.6 μm (% by weight) | Spherical fused silica (C") having average particle diameter of 23.8 μm (% by weight) |
| I | 70 | 0 | 30 |
| II | 0 | 90 | 10 |
| III | 0 | 70 | 30 |
| IV | 0 | 40 | 60 |
| V | 0 | 30 | 70 |

TABLE 3

| | Silane coupling agent |
|---|---|
| | Structure |
| I | ⟨phenyl⟩—NHCH$_2$CH$_2$CH$_2$Si(OCH$_3$)$_3$ |
| II | H$_2$NCH$_2$CH$_2$NHCH$_2$CH$_2$CH$_2$Si(OCH$_3$)$_3$ |

TABLE 3-continued

Silane coupling agent

Structure

III    CH$_2$——CHCH$_2$OCH$_2$CH$_2$CH$_2$Si(OCH$_3$)$_3$
          \ /
           O

The moldability characteristics such as formation of resin flash and hot hardness of the obtained composition were evaluated. Furthermore, a device having test elements was molded, encapsulated, and post-cured, and the reliability and solder dipping stability were evaluated.

The solder dipping stability was evaluated by post-curing a 44-pin QFP having encapsulated test elements for 5 hours, humidifying the QFP at a temperature of 65° C. and a relative humidity of 95% for 24 hours, dipping the QFP In

TABLE 6

Results of Example 1

| | | Composition | | | | Evaluation results | | | |
|---|---|---|---|---|---|---|---|---|---|
| | | Silane coupling agent | | Fused silica | | Moldability characteristics | | | |
| | Curing promoter Kind | Kind | Amount added (% by weight) | Kind | Amount added (% by weight) | Spiral flow (cm) | Resin flash (mm) | Hot hardness (Shore D) | Reliability (hours) |
| Run 1 | TPP | I | 0.5 | I | 74.0 | 72 | 1.0 | 86 | 530 |
| Run 2 | TPP | I | 1.0 | I | 74.0 | 76 | 1.5 | 88 | 510 |
| Run 3 | DBU | I | 0.5 | I | 74.0 | 70 | 1.0 | 85 | 400 |
| Comparative run 1 | TPP | II | 0.5 | I | 74.0 | 55 | 3.0 | 83 | 290 |
| Comparative run 2 | TPP | III | 0.5 | I | 74.0 | 63 | 6.0 | 81 | 270 |
| Comparative run 3 | TPP | — | — | I | 74.0 | 60 | 7.0 | 79 | 60 |

EXAMPLE 2

Each fused silica shown in Table 2 and a silane coupling agent (I) shown in Table 3 were dry-blended together by using a mixer to give fused silica surface-treated with the silane coupling agent. Using the resulting surface-treated fused silica, dry blending was carried out at the mixing ratios shown in Tables 1 and 7 by using a mixer. The blend was heated and kneaded for 5 minutes by using a mixing roll having a surface temperature maintained at 90° C., and then cooled and pulverized to prepare an epoxy resin composition.

a solder bath maintained at 245° C. for 5 seconds, and determining the ratio (%) of QFP at which cracking did lot occur.

The results are shown in Table 7.

As seen from the results shown in Table 7, the epoxy resin composition containing 70 to 95% by weight of the fused silica (C) surface-treated with the silane coupling agent having a secondary amino group according to the present invention (runs 4 and 6 through 8) has an excellent moldability, reliability, and solder dipping stability.

TABLE 7

Results of Example 2

| | | Composition | | | | Results of Evaluation | | | |
|---|---|---|---|---|---|---|---|---|---|
| | | Silane coupling agent | | Fused silica | | Moldability characteristics | | | |
| | Curing promoter Kind | Kind | Amount added (% by weight) | Kind | Amount added (% by weight) | Resin flash (mm) | Hot hardness (Shore D) | Reliability (hours) | Solder dipping stability (%) |
| Run 1 | TPP | I | 0.5 | I | 74.0 | 1.0 | 86 | 530 | 15 |
| Run 4 | TPP | I | 0.5 | II | 74.0 | 1.0 | 86 | 590 | 80 |
| Run 5 | TPP | I | 1.0 | III | 71.0 | 1.0 | 85 | 570 | 10 |
| Run 6 | TPP | I | 0.5 | II | 74.0 | 2.0 | 87 | 540 | 70 |
| Run 7 | TPP | I | 0.5 | IV | 74.0 | 1.0 | 86 | 560 | 65 |
| Run 8 | TPP | I | 0.5 | IV | 76.0 | 2.0 | 88 | 600 | 70 |
| Run 9 | TPP | I | 0.5 | V | 74.0 | 1.5 | 85 | 570 | 20 |

EXAMPLE 3

Fused silica (I) shown in Table 2 and a silane coupling agent (I) shown in Table 3 were dry-blended together by using a mixer to give fused silica surface-treated with the silane coupling agent. Using the resulting surface-treated fused silica and a modified silicone oil (F) shown in Table 4, dry-blending was carried out at the mixing ratios shown in Tables 1 and 8 by using a mixer. The blend was heated and kneaded for 5 minutes by using a mixing roll having a surface temperature maintained at 90° C., and then cooled and pulverized to prepare an epoxy resin composition.

The formation of resin flash and hot hardness of the obtained resin composition were evaluated by the low-pressure transfer molding method, a flexural test piece was molded and post-cured and the flexural modulus of elasticity thereof was measured according to ASTM D-790, and further, a device having encapsulated test elements was molded and post-cured and the reliability thereof was evaluated. The results are shown in Table 8.

From the results shown in Table 8, it is seen that the epoxy resin composition comprising the modified silicone oil (F) according to the present invention (Run No. 10 through No. 13) has an excellent moldability, and a reliability further improved. Moreover, the flexural modulus of elasticity is reduced and a reduction of stress is obtained.

TABLE 4

| Modified silicone oil (F) | Content |
|---|---|
| I | Carboxylic acid-modified silicone oil, SF8418 supplied by Toray Silicone |
| II | Epoxy-modified silicone oil, X-60-164 supplied by Shinetsu Silicone |
| III | Silicone oil having both terminals modified with amino groups, X-22-161A supplied by Shinetsu Silicone |
| IV | Silicone oil having both terminals modified with carboxylic acid, BY15-750 supplied by Toray Silicone | mixer to give fused silica surface-treated with the silane coupling agent. Using the resulting surface-treated fused silica, dry blending was carried out at the mixing ratios shown in Tables 5 and 9, and the blend was treated in the same manner as described in Example 1 to obtain an epoxy resin composition. The moldability, reliability and solder dipping stability thereof were evaluated. The results are shown in Table 9.

In the present example, the physical properties were evaluated according to the following methods.

(Formation of Resin Flash)

Molding was carried out at 175° C. for 90 seconds and the formation of resin flash was observed.

(Hot Hardness)

Molding was carried out at 175° C. for 120 seconds, and the hot hardness was evaluated.

(Reliability)

A 16-Pin DIP having encapsulated test elements was molded and post-cured at 175° C. for 5 hours. This device was subjected to USPCBT (unsaturated pressure cooker bias test) at a temperature of 135° C. and a relative humidity of 85% under a bias voltage of 15 V, and the time required for the cumulative failure rate to reach 50% was measured.

(Solder Dipping Stability)

A 44-Pin QFP having encapsulated elements was post-cured at 175° C. for 5 hours, humidified at a temperature of 85° C. and a relative humidity of 85% for 50 hours and dipped in a solder bath maintained at 260° C. for 10 seconds, and the ratio (%) of QFP at which cracking did not occur was determined.

The results are shown in Table 9.

As seen from the results shown in Table 9, the epoxy resin composition of the present invention (runs 14 through 17) has excellent moldability characteristics such as a formation of resin flash and hot hardness, and reliability. If the epoxy resin I (biphenyl type epoxy resin) is incorporated, even under such severe conditions as a 10 second dip in a solder bath maintained at 260° C. after 50 hours' humidification at a temperature of 85° C. and a relative humidity of 85%, the solder dipping stability is 40% or higher and is very good.

In contrast, where a silane coupling agent which does not

TABLE 8

Results of Example 3

| | Composition | | | | | | Evaluation characteristics | | | |
|---|---|---|---|---|---|---|---|---|---|---|
| | Silane coupling agent | | Fused silica | | Modified silicone oil (F.) | | Moldability characteristics | | Flexural | |
| | Curing promoter Kind | Kind | Amount added (% by weight) | Kind | Amount added (% by weight) | Kind | Amount added (% by weight) | Resin flash (mm) | Hot hardness (Shore D) | modulus of elasticity (kg/mm²) | Reliability (hours) |
| Run 1 | TPP | I | 0.5 | I | 74.0 | — | — | 1.0 | 86 | 1820 | 530 |
| Run 10 | TPP | I | 0.5 | I | 74.0 | I | 1.0 | 1.0 | 86 | 1610 | 670 |
| Run 11 | TPP | I | 0.5 | I | 74.0 | II | 1.5 | 1.0 | 84 | 1490 | 680 |
| Run 12 | TPP | I | 0.5 | I | 74.0 | III | 2.0 | 1.0 | 83 | 1370 | 630 |
| Run 13 | TPP | I | 0.5 | I | 74.0 | IV | 1.0 | 2.0 | 84 | 1560 | 600 |

EXAMPLE 4

Fused silica shown in Table 2 and a silane coupling agent shown in Table 3 were dry-blended together by using a have a secondary amino group is used (comparative run 4), the moldability and reliability are poor.

TABLE 5

Epoxy resin composition

| Component | Content | Amount added (% by weight) |
|---|---|---|
| Epoxy resin I | 4,4'-Bis(2,3-epoxypropoxy)-3,3',5,5'-tetramethylbiphenyl | * |
| Epoxy resin II | o-Cresol-novolak epoxy resin having epoxy equivalent of 200 | * |
| Curing agent | Phenol-novolak resin having hydroxyl equivalent of 107 | the remainder |
| Curing promoter | Triphenylphosphine | 0.2 |
| Release agent | Carnauba wax | 0.3 |
| Flame retardant | Brominated phenol-novolak resin having epoxy equivalent 270 and bromine content of 36% | 2.3 |
| Flame retardant | Antimony trioxide | 1.5 |
| Colorant | Carbon black | 0.2 |

Note
*shown in Table 9.

TABLE 9

Results of Example 4

| | Composition | | | | | Evaluation results | | | |
|---|---|---|---|---|---|---|---|---|---|
| | Epoxy resin | | Silane coupling agent (D) | | Fused silica | | Molding characteristics | | |
| | I | II | | | | | | | |
| | Amount added (% by weight) | Amount added (% by weight) | Kind | Amount added (% by weight) | Kind | Amount added (% by weight) | Resin flash (mm) | Hot hardness (Shore D) | Reliability (hours) | Solder dipping stability (%) |
| Run 14 | 10.0 | — | I | 0.5 | I | 78.0 | 1.0 | 84 | 400 | 45 |
| Run 15 | 10.0 | — | I | 1.0 | I | 78.0 | 1.0 | 86 | 450 | 40 |
| Run 16 | 5.0 | 5.0 | I | 0.5 | II | 78.0 | 1.0 | 85 | 450 | 40 |
| Run 17 | 10.0 | — | I | 0.5 | II | 78.0 | 1.0 | 81 | 420 | 85 |
| Comparative run 4 | 10.0 | — | II | 0.5 | II | 78.0 | 5.0 | 55 | 200 | 40 |

EXAMPLE 5

Fused silica (I) shown in Table 2 and a silane coupling agent shown in Table 3 were dry-blended together by using a mixer to give fused silica surface-treated with the silane coupling agent. The resulting surface-treated fused silica and an aromatic vinyl hydrocarbon-conjugated diene block copolymer [polystyrene/polybutadiene/polystyrene hydrogenated triblock copolymer (styrene/butadiene weight ratio= 25/75; number average molecular weight=$1.2\times10^5$)] (E) were blended at the mixing ratios shown in Tables 1 and 10, and in the same manner as described in Example 1, an epoxy resin composition was prepared and the moldability, reliability and solder dipping stability were evaluated.

The evaluation conditions and evaluation results are shown in Table 10.

In the present example, the physical properties were determined according to the following methods.

(Reliability)

An 80-Pin QFP having encapsulated test elements was molded and post-cured at 175° C. for 5 hours. This QFP was subjected to USPCBT (unsaturated pressure cooker test) at a temperature of 130° C. and a relative humidity of 85% under a bias voltage of 10 V, and the time required for the cumulative failure rate to reach 50% was measured.

(Solder Dipping Stability)

An 80-Pin QFP having encapsulated test elements was molded and post-cured at 175° C. for 5 hours, humidified at a temperature of 85° C. and a relative humidity of 85% for 50 hours and dipped in a solder bath maintained at 250° C. for 10 seconds, and the ratio (%) of QFP at which cracking did not occur was evaluated.

The results are shown in Table 10.

As seen from the results shown in Table 10, the epoxy resin composition of the present invention (runs 18 and 19) has a high hot hardness and excellent moldability and reliability, and if the aromatic vinyl hydrocarbon-conjugated diene block copolymer (E) is incorporated, the solder dipping stability is improved.

In contrast, where a silane coupling agent which does not have a secondary amino group is used (comparative run 5), the reliability is only 430 hours even under relatively mild conditions of a temperature of 130° C., a relative humidity of 85% and a bias voltage of 10 V, and the reliability is poor.

TABLE 10

| | Composition | | | | | | Evaluation results | | |
|---|---|---|---|---|---|---|---|---|---|
| | Styrenic block copolymer (E) | | Silane coupling agent | | Fused silica | | | | |
| | Curing promoter Kind | Amount added (% by weight) | Kind | Amount added (% by weight) | Kind | Amount added (% by weight) | Modability characteristics Hot hardness (Shore D) | Relia-bility (hours) | Solder dipping stability (%) |
| Run 18 | TPP | 2.5 | I | 0.5 | I | 72.5 | 86 | 750 | 60 |
| Run 19 | TPP | 2.5 | I | 1.0 | I | 72.5 | 85 | 720 | 60 |
| Comparative run 5 | TPP | 2.5 | II | 0.5 | I | 72.5 | 84 | 430 | 55 |

We claim:

1. A semiconductor-encapsulating epoxy resin composition comprising:

(A) an epoxy resin having at least two epoxy groups, (B) a curing agent selected from at least one member of the group consisting of a phenol-novolak resin, a cresol-novolak resin, a novolak resin represented by the following formula:

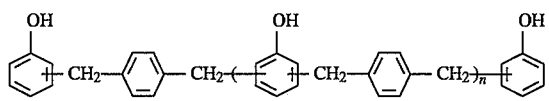

wherein n is zero or an integer of at least 1, a novolak resin synthesized from bisphenol A or resorcinol, and polyhydric phenol compounds, and (C) fused silica which comprises 40 to 90% by weight of crushed fused silica having an average particle diameter not larger than 12 μm and 10 to 60% by weight of spherical fused silica having an average particle diameter not larger than 40 μm said percentages being based on the total of crushed and spherical fused silica, and said average particle diameter being defined as the median particle diameter at which the cumulative weight is 50 percent, and which has been surface-treated with a silane coupling agent having an amino group which is a secondary amino group, or having amino groups, wherein said amino group or amino groups are all secondary amino groups;

said epoxy resin being present in an amount of from 3 to 30% by weight of said composition, and said fused silica being present in an amount of from 70 to 95% by weight of said composition.

2. A semiconductor-encapsulating epoxy resin composition according to claim 1, wherein said epoxy resin (A) comprises a biphenyl epoxy resin having a skeleton represented by the following formula (I) as an indispensable component:

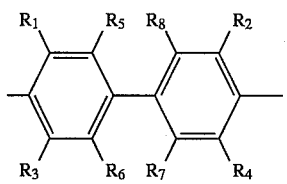

wherein $R^1$ through $R^8$ independently represent a hydrogen atom, a lower alkyl group having 1 to 4 carbon atoms or a halogen atom.

3. A semiconductor-encapsulating epoxy resin composition according to claim 1, wherein the curing agent (B) is a phenol-novolak resin.

4. A semiconductor-encapsulating epoxy resin composition according to claim 1, wherein the amount of the curing agent (B) is 1 to 20% by weight based on the weight of the total resin composition.

5. A semiconductor-encapsulating epoxy resin composition according to claim 1, wherein the amount of the surface-treated fused silica (C) is 73 to 90% by weight based on the weight of the total resin composition.

6. A semiconductor-encapsulating epoxy resin composition according to claim 1, wherein said fused silica has been surface-treated with 0.1 to 5 parts by weight of the silane coupling agent per 100 parts by weight of the fused silica.

7. A semiconductor-encapsulating epoxy resin composition according to claim 1, wherein said secondary amino group-containing silane coupling agent is N-phenyl-3-aminopropyltrimethoxysilane.

8. A semiconductor-encapsulating epoxy resin composition according to claim 1, which further comprises (E) an aromatic vinyl hydrocarbon-conjugated diene block copolymer.

9. A semiconductor-encapsulating epoxy resin composition according to claim 1, which further comprises (G) an organic phosphine compound.

10. The semiconductor-encapsulating epoxy resin composition of claim 1, wherein said epoxy resin is selected from at least one member of the group consisting of a cresol-novolak epoxy resin, a biphenyl epoxy resin, a bisphenol A epoxy resin, a linear aliphatic epoxy resin, an alicyclic epoxy, a heterocyclic epoxy resin, a halogenated epoxy resin and a spiro ring-containing epoxy resin.

* * * * *